United States Patent [19]

Caputo

[11] 4,434,874
[45] Mar. 6, 1984

[54] ELEVATOR SYSTEM
[75] Inventor: William R. Caputo, Wyckoff, N.J.
[73] Assignee: Westinghouse Electric Corp., Pittsburgh, Pa.
[21] Appl. No.: 356,684
[22] Filed: Mar. 10, 1982
[51] Int. Cl.³ .............................................. B66B 1/30
[52] U.S. Cl. .................................................. 187/29 R
[58] Field of Search ........................................ 187/29

[56] References Cited
U.S. PATENT DOCUMENTS

| | | | |
|---|---|---|---|
| 4,161,235 | 7/1979 | Caputo et al. | 187/29 |
| 4,161,236 | 7/1979 | Husson | 187/29 |
| 4,318,456 | 3/1982 | Lowry | 187/29 |
| 4,356,896 | 11/1982 | Tamura et al. | 187/29 |

Primary Examiner—J. V. Truhe
Assistant Examiner—W. E. Duncanson, Jr.
Attorney, Agent, or Firm—D. R. Lackey

[57] ABSTRACT

A feedback controlled elevator system including a speed pattern generator for providing a speed pattern signal responsive to desired speed. A limiting signal responsive to the absolute position of the elevator car is compared with the speed pattern signal, and the lesser of these two signals is compared with a velocity signal to determine speed error.

12 Claims, 11 Drawing Figures

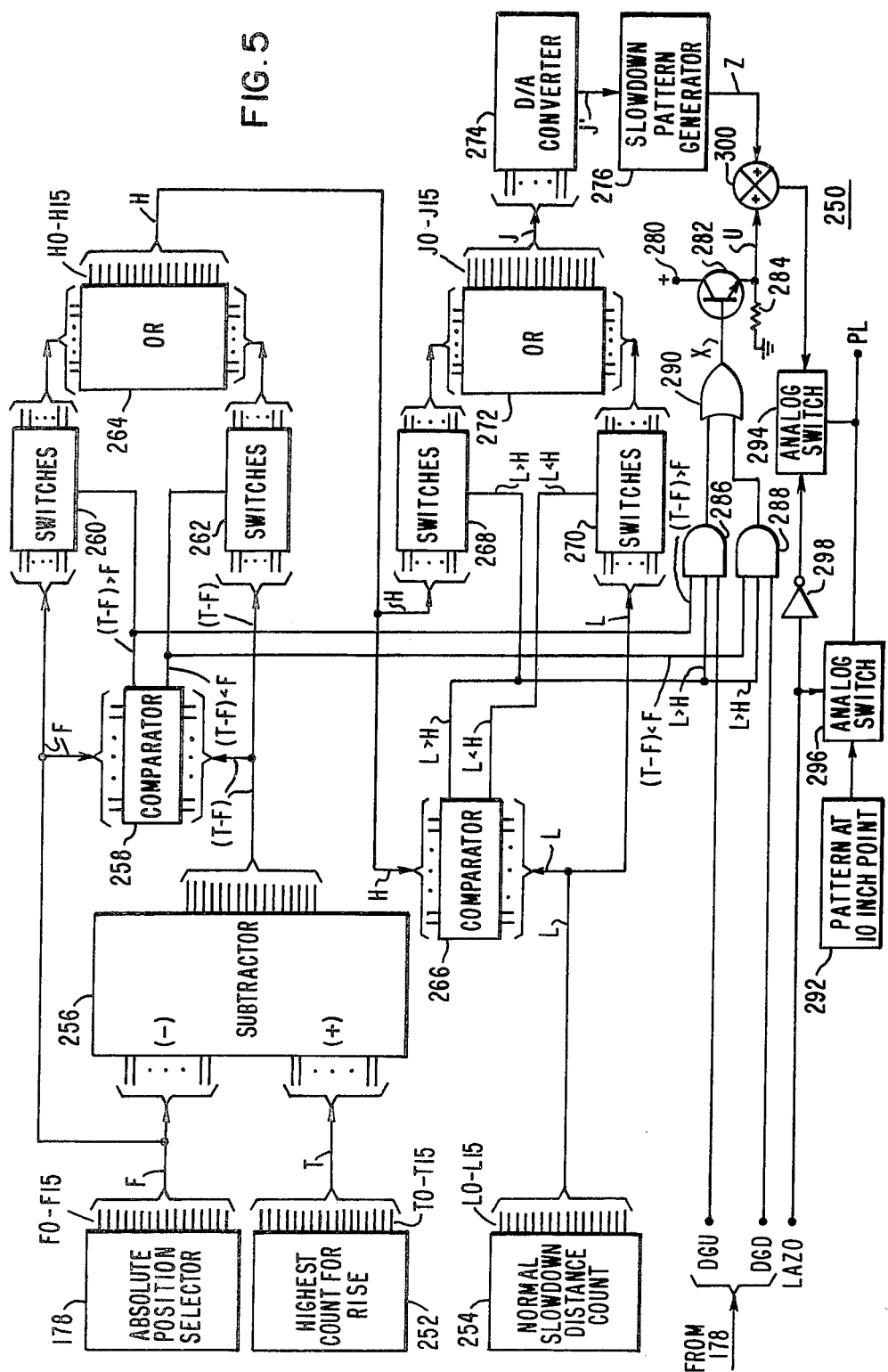

SHORT RUN INTO
THE UPPER TERMINAL

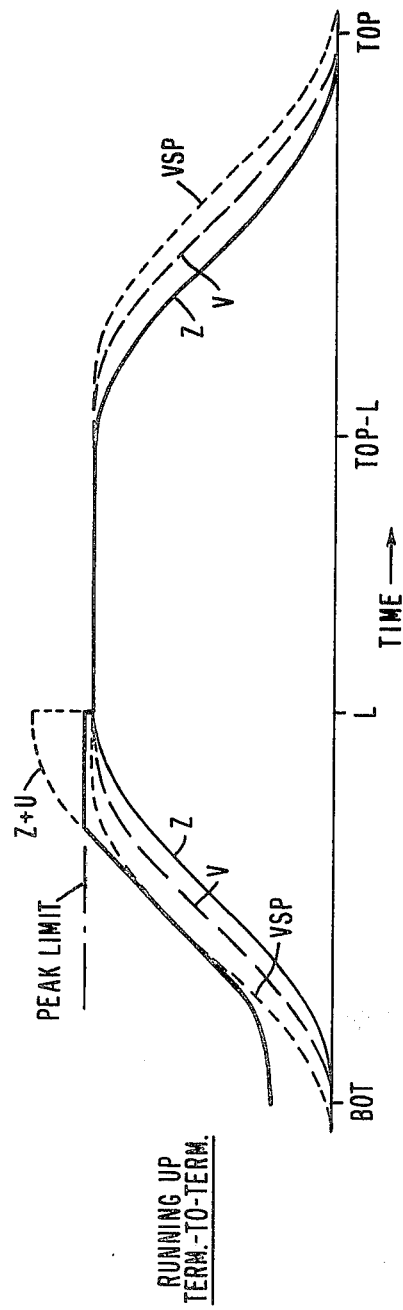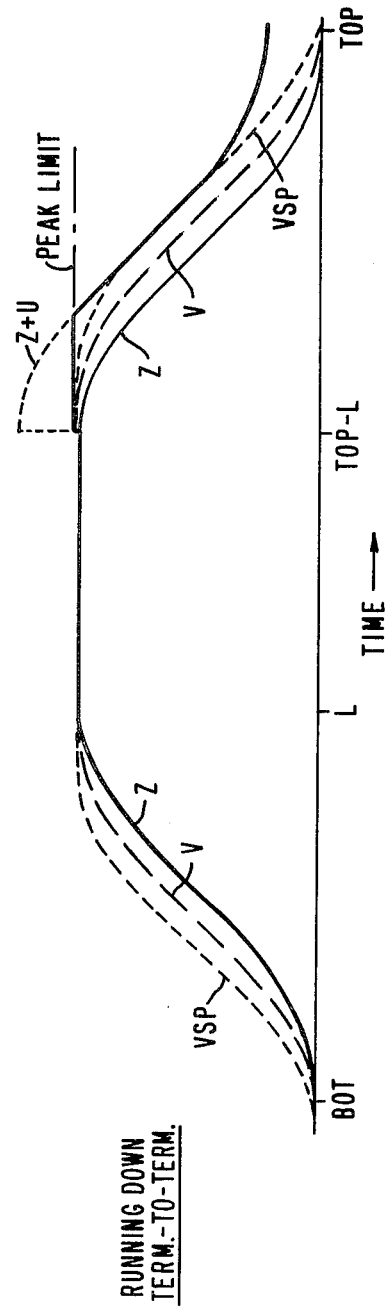

ELEVATOR SYSTEM

BACKGROUND OF THE INVENTION

1. Field of the Invention

The invention relates in general to elevator systems, and more specifically to feedback controlled elevator systems which compare a signal responsive to the actual speed of an elevator car with a speed pattern signal.

2. Description of the Prior Art

U.S. Pat. No. 4,161,235, which is assigned to the same assignee as the present application, discloses an elevator system in which predetermined parameters of the speed pattern signal, such as its rate of change, and its peak or maximum value, are monitored and compared with predetermined reference values. The exceeding of a reference value by a monitored parameter results in the clamping of the speed pattern such that it cannot exceed about 1.1 times the normal acceleration rate, and about 1.01 times the normal full speed. Slope limiting of the speed pattern, and smoothly blending the acceleration and full speed portions of the pattern, accomplished while limiting the maximum value of the speed pattern, are also disclosed.

In order for the floor selector of an elevator car to make proper, timely decisions, such as when to initiate the slowdown portion of the speed pattern signal, the position of the elevator car must be known to the floor selector. An arrangement suitable for solid state controls is disclosed in U.S. Pat. No. 3,750,850, which is assigned to the assignee of the present application. This solid state selector arrangement determines car position by incremental counting. Pulses are generated by a pulse wheel as the elevator car moves in the hatch, and these pulses increment a car position counter up or down, depending upon the travel direction assigned to the car by the floor selector. This arrangement works very well, but is subject to certain errors, such as when the elevator car "rolls back", i.e. moves in a direction opposite to the assigned travel direction. Pulses generated during this slight movement will cause the counter to be incremented in the wrong direction. Noise pulses also cause errors, as does wear of the apparatus driving the pulse wheel, such as cable wear and sheave wear. Errors may also be due to governor cable creepage on the sheave which drives the pulse wheel. Loss of power also causes the position counter to lose its count.

Finally, an elevator system, such as the one disclosed in U.S. Pat. No. 4,161,235, requires a completely independent, redundant terminal slowdown and stopping arrangement for each elevator car. The function of this arragnement is to slow down and stop the car automatically at the top and bottom terminal landings, should the normal slowdown and stopping arrangement fail to function properly. U.S. Pat. No. 3,779,346, which is assigned to the same assignee as the present application, sets forth an example of an independent terminal slowdown control which may be used. Regardless of the type of independent terminal slowdown arrangement, it usually involves a certain amount of hatch equipment mounted near each terminal floor, and additional processing circuitry. In these arrangements, the need for independent terminal slowdown operation must first be detected, and then the speed pattern is modified to cause the car to make a reasonable approach to the terminal floor.

SUMMARY OF THE INVENTION

Briefly, the present invention is a new and improved elevator system which determines the true or absolute position of the elevator car at predetermined increments of car travel, such as eight inches, throughout the hatch. A car position counter is forced to the correct binary count at each increment. This count is the binary address of the elevator car at that instant, with reference to the bottom terminal landing. After a power loss, the car need only be moved by this small increment to reset the car position counter and normal floor selector.

A three-pulse arrangement detects car movement and travel direction between the absolute determinations of car position, which arrangement also decodes the pulses to determine the actual travel direction of the car. The pulses and derived travel direction are used to clock the absolute position counter up or down, depending upon actual travel direction, to maintain the car position to some small resolution, such as 0.5 inch.

The absolute position of the elevator car is used to develop a speed pattern limit signal according to car position. The minimum would be to develop the limit signal in the top and bottom terminal zones as the elevator car approaches the top and bottom terminal floors, respectively. In a preferred embodiment, a continuous pattern limit signal is developed for every car position throughout the entire hatch. This continuous pattern limit signal may function as a variable reference limit signal into the pattern clamp arrangement of the hereinbefore mentioned U.S. Pat. No. 4,161,235.

Instead of detecting the need for pattern clamping by a reference set slightly higher than the desired value, which necessarily means the normal pattern must exceed its normal or desired value by a predetermined percentage before clamping is invoked, the continuous slowdown pattern limit developed adjacent to each terminal landing may be processed in the same manner as the normal slowdown speed pattern. The only difference being the fact that it will use the absolute position of the elevator car as it approaches the terminal landing, instead of a distance-to-go count which is decremented by car movement. Thus, the normal slowdown pattern and the slowdown pattern limit signal will normally have substantially the same values at any instant as the elevator car approaches the terminal floor. By comparing the normal speed pattern with the pattern limit signal in the pattern clamp of U.S. Pat. No. 4,161,235, the pattern limit will be automatically substituted for the normal pattern the instant the normal pattern exceeds the limit pattern. The transfer between patterns will be smooth and accomplished without waiting for the normal pattern to reach some predetermined value before switching speed patterns. This continuous monitoring of the speed pattern as the elevator approaches a terminal floor is an independent system which performs the required independent, redundant protection without special terminal slowdown hatch hardware and circuitry. The prior art speed switch, however, would still be retained.

Thus, the present invention improves upon the pattern clamp arrangement of U.S. Pat. No. 4,161,235; it solves the error problems and loss of memory problems of prior art solid state selectors; and it performs the required independent terminal slowdown protection without the use of special terminal slowdown hatch equipment adjacent to each terminal, and special terminal slowdown processing circuitry. In addition, the invention provides a speed pattern clamping signal which can function to clamp the speed pattern throughout a complete run, based upon the absolute position of the elevator car at any instant.

BRIEF DESCRIPTION OF THE DRAWINGS

The invention may be better understood, and further advantages and uses thereof more readily apparent, when considered in view of the following detailed description of exemplary embodiments, taken with the accompanying drawings in which:

FIG. 5 is a schematic diagram of a speed pattern limit generator which may be used for this function shown in block form in FIG. 1;

FIG. 9 is a graph which illustrates the speed pattern for a car running up, terminal to terminal, subjected to pattern limiting according to the teachings of the invention;

FIG. 10 is a graph similar to the graph shown in FIG. 9, except for an elevator car running downwardly, terminal to terminal.

DESCRIPTION OF PREFERRED EMBODIMENTS

Figure 1:
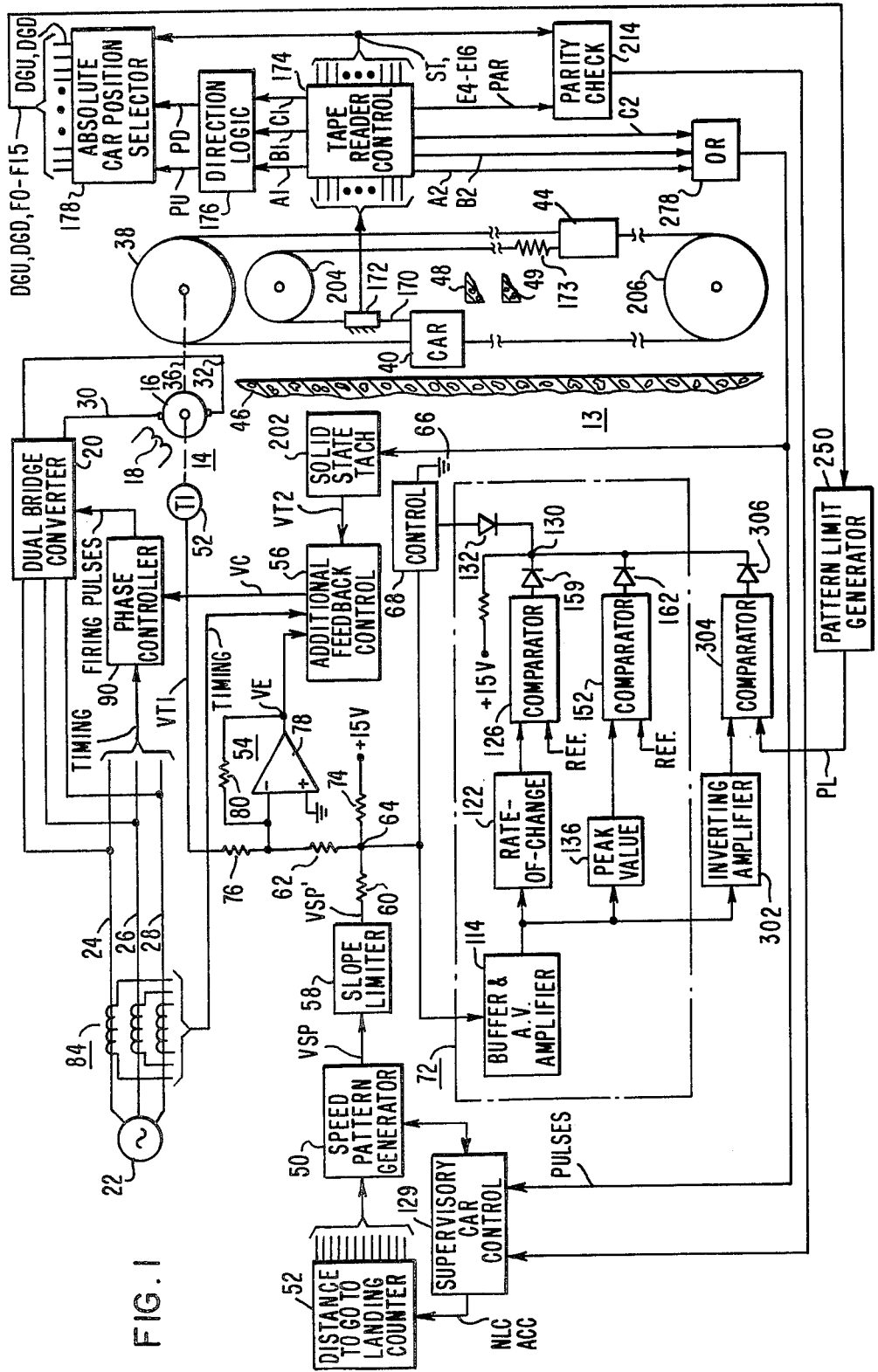
FIG. 1 is a schematic diagram of an elevator system constructed according to the teachings of the invention.

Referring now to the drawings, and to FIG. 1 in particular, there is shown a schematic diagram of an elevator system 13 constructed according to the teachings of the invention. Elevator system 13 includes a drive motor, such as the direct current drive motor 14 illustrated which includes an armature 16 and a field winding 18. The armature 16 is electrically connected to an adjustable source of direct current potential. The source of potential may be a direct current generator of a motor generator set in which the field current of the generator is controlled to provide a desired magnitude and polarity of unidirectional potential; or, as shown in FIG. 1, the source of direct current potential may be a static source, such as a dual converter 20.

As is well known in the art, the dual converter 20 includes a plurality of static, controlled rectifier devices connected to interchange electrical power between alternating and direct current circuits. The alternating current circuit includes a source 22 of alternating potential and buses 24, 26 and 28. The direct current circuit includes buses 30 and 32, to which the armature 16 of the direct current motor 14 is connected. The field winding 18 of drive motor 14 is connected to a suitable source of direct current potential, such as a single bridge converter (not shown). The invention also applies to elevator systems dirven by an AC motor, when the system is controlled by a speed pattern generator.

The drive motor 14 includes a drive shaft, indicated generally by broken line 36, to which a traction sheave 38 is secured. An elevator car 40 is supported by wire ropes 42 which are reeved over the traction sheave 38, with the other ends of the ropes 42 being connected to a counterweight 44. The elevator car is disposed in a hatch or hoistway 46 of a structure having a plurality of floors, or landings, such as floor 48 which represents the top terminal floor or landing, and floor 49 which represents the bottom terminal floor or landing. A tachometer 52 may be responsive to the rotation of shaft 36, to provide signal VT1 responsive to the speed of the elevator car 40.

The movement mode of the elevator car 40 and its position in the hoistway are controlled by the voltage magnitude applied to the armature 16 of the drive motor 14. The magnitude of the direct current voltage applied to armature 16 is responsive to a speed pattern signal or velocity command signal VSP provided by a suitable speed pattern generator 50 which may include a distance-to-go-to the-landing counter 52. For example, the speed pattern generator may be constructed as disclosed in U.S. Pat. No. 3,774,729, which is assigned to the same assignee as the present application. A servo control loop 54 controls the speed of the drive motor, and thus the position of the elevator car 40, in response to the velocity command signal VSP. Any suitable servo control loop may be used, such as the control loop disclosed in the hereinbefore mentioned U.S. patents as well as improvements thereon, such as disclosed in U.S. Pat. No. 4,030,570, which is assigned to the same assignee as the present application.

For purposes of describing the present invention, the control loop 54 is illustrated as being responsive to supervisory control 129, which receives calls for elevator service and signals responsive to the location and travel direction of the elevator car 40. In response to these calls and signals, the supervisory control provides pulses NLC for incrementing, and decrementing, counter 52, and signals for controlling the speed pattern generator 50 to initiate the acceleration and deceleration portions of the speed pattern signal VSP as required to serve the calls for elevator service. Suitable supervisory control is disclosed in the hereinbefore mentioned U.S. Pat. No. 3,774,729.

The present invention may utilize the monitoring and limiting functions disclosed in the hereinbefore mentioned U.S. Pat. No. 4,161,235. This patent is hereby incorporated into the present application by reference. For example, the speed pattern signal VSP may be applied to a slope limiting function 58. The slope limiting function prevents any quick change in the speed pattern signal, limiting the maximum rate of change thereof to a corresponding maximum acceleration and deceleration rate. The slope limiting function enables the monitoring and limiting functions, which are located further downstream in the control loop, to handle pattern reversal or failure of the speed pattern generator, i.e. pattern drop-out. The slope limiting function 58 limits the rate of change of the speed pattern signal to a value which can be adequately monitored by the monitoring and limiting functions of the invention. The slope limited speed pattern signal is referenced VSP', in order to indicate that it has been processed by the slope limiting function.

The summing resistor for the speed pattern signal VSP' is divided into two serially connected resistors 60 and 62, each equal to one-half of the value of the usual summing resistor. The junction 64 between resistors 60 and 62 is connected to ground 66 via a controllable impedance device 68. The controllable impedance device may be a field effect transistor, which is desirable because of its high input impedance. Also, it is voltage controlled, requiring an almost insignificant gate current. The controllable impedance device 68 is controlled by a monitoring and limiting function 72, which monitors the speed pattern signal VSP' and junction 64. Junction 64 is also connected to a positive source of potential, such as +15 volts, via a resistor 74. Resistor 74 has a large value, such as 4.7 megohms, which is selected to cancel the small amount of biasing current drawn by the monitoring and limiting functions. The signal appearing at junction 64, which may be called an auxiliary speed pattern signal representing the desired speed of the elevator car, and the velocity feedback signal VT1, which represents the actual speed of the elevator car, are applied to a summing point to provide a difference signal which is applied to an error amplifier 54. The amplified error signal VE is additionally processed in feedback control, shown generally at 56, with such feedback, for example, including a current signal from current transformers 84, and a velocity signal VT2 which may be differentiated to obtain an acceleration signal for stabilization purposes. The feedback circuits are described in the hereinbefore mentioned U.S. patents. The additional feedback control 56 provides a control signal VC for a phase controller 90, which receives waveform information from buses 24, 26 and 28, and it provides firing pulses for the controllable switching devices of the dual bridge converter 20.

The velocity signal VT1 is applied to an input of error amplifier 54 via a resistor 76. Error amplifier 54 may be an operational amplifier (op amp) 78 having a feedback resistor 80. Resistors 62 and 76 are connected to the inverting input of op amp 78, and the non-inverting input is connected to ground.

In the operation of the elevator system 13, the controllable impedance device 68 is biased to its nonconductive state. The monitoring and limiting function 72 is designed with a high input impedance, and thus it does not load the control loop. Thus, when the speed pattern signal VSP' is not exceeding any of the preset limits of the monitored parameters, the monitoring and limiting function 72 has no affect on the speed pattern signal.

The monitoring and limiting function 72 modifies the affect of the speed pattern signal on the error amplifier by reducing the impedance of the controllable impedance device 68 by a controlled magnitude, which results in pulling the speed pattern signal closer to ground, regardless of the polarity of the speed pattern signal. The impedance of the controllable impedance device 68 is reduced to the point necessary to bring the speed pattern signal within pre-set limits established for the speed pattern signal.

The monitoring and limiting function 72 includes an input buffer and absolute value function 114, to which the speed pattern signal VSP' is applied. A first parameter of the speed pattern signal which may be monitored is the rate of change of the signal, i.e. acceleration, such as provided by an acceleration monitoring function 122.

The output of amplifier 114 is applied to the rate-of-change function 122. The output of function 122 is a positive signal having a magnitude responsive to the rate of change of the speed pattern signal VSP'. This output signal is applied to a comparator 126. A positive reference voltage is applied to comparator 126. The positive reference voltage is selected such that the acceleration limit has the desired value, such as about 1.1 times the normal acceleration rate.

As long as the input voltage to the comparator 126 from function 122 is less than the reference voltage, the output of comparator 126 will be negative. When the output from the acceleration circuit 122 exceeds the reference, the output of comparator 126 switches to a positive polarity. The output of comparator 126 is connected to a junction 130 via a diode 159. Diode 159 is poled to conduct current towards junction 130. Junction 130 is connected to the controllable impedance device 68 via a diode 132. Diode 132 is poled to conduct current towards junction 130.

When the output of comparator 126 switches to a positive polarity, indicating acceleration limiting is necessary, junction 130 becomes less negative, and the impedance of device 68 is reduced accordingly, allowing current flow therethrough. If the pattern signal has a positive polarity at this time, current flows away from junction 64 to pull the pattern towards ground. If the pattern signal has a negative polarity at this time, current flows towards junction 64, which also pulls the speed pattern signal towards ground.

Another parameter of the speed pattern signal VSP' which may be monitored is the maximum value of the pattern signal. This monitoring function is indicated by function 136 in FIG. 1. The output of function 136 is applied to a comparator 152 which may be similar to comparator 126. A reference voltage for comparator 152 is selected to provide the desired peak pattern limit, such as 1.01 times full speed. When the output of function 136 exceeds the reference, indicating speed limiting is necessary, the output of comparator 152 switches to a positive polarity and diode 162 applies a positive voltage to junction 130. This positive voltage makes junction 130 less negative, and the resistance of control device 68 is reduced to allow the necessary current flow for limiting the pattern signal.

The description to this point is a general description of the speed pattern clamp disclosed in the incorporated patent. More detailed information may be obtained by referring to this patent.

A first aspect of the present invention relates to obtaining a signal responsive to the absolute position of elevator car 40 in hatch 46. Knowledge of true car position is utilized in a second aspect of the invention, which relates to the generation of a global pattern limiting signal. This signal is generated without any additional hatch equipment, other than mechanical connections to the car. The generation of the global pattern limiting signal is utilized in a third aspect of the invention, which relates to an elevator car approaching a terminal floor in the terminal slowdown zone. In this aspect of the invention, the pattern limit generated is used as a variable reference into the pattern clamping function, collectively represented by functions 68 and 72 in FIG. 1. In effect, this amounts to an analog AND circuit, causing the outputted speed pattern, i.e. the voltage appearing at junction 64, to always agree with the input having the least magnitude. In other words, the outputted speed pattern will follow the normal pattern VSP' when it is less than the pattern limit signal, and the outputted pattern will follow the pattern limit when the normal speed pattern signal exceeds the pattern limit signal.

More specifically, the absolute position of the elevator car 40 is preferably determined by a coded tape 170 having a straight binary code thereon, a tape reader 172, tape reader control 174, direction logic 176, and an absolute car position counter or selector 178.

It is desirable to determine the position of the elevator car 40 to a small increment, such as 0.5 inch resolution. If absolute position is determined to this resolution, it would require a tape having sixteen vertical lanes, to provide a sixteen bit binary address every 0.5 inch for the building rise which may be involved. This is not a practical solution. Thus, the present invention determines the absolute position of the car to the 0.5 inch resolution at predetermined larger increments of travel, such as once every eight inches of car travel. By selecting eight inches as the travel increment, only a single vertical lane of binary code is required, and sixteen bit capacity is provided by only 12 reader heads, as the four least significant bits (LSB) will always be zero.

Figure 2:
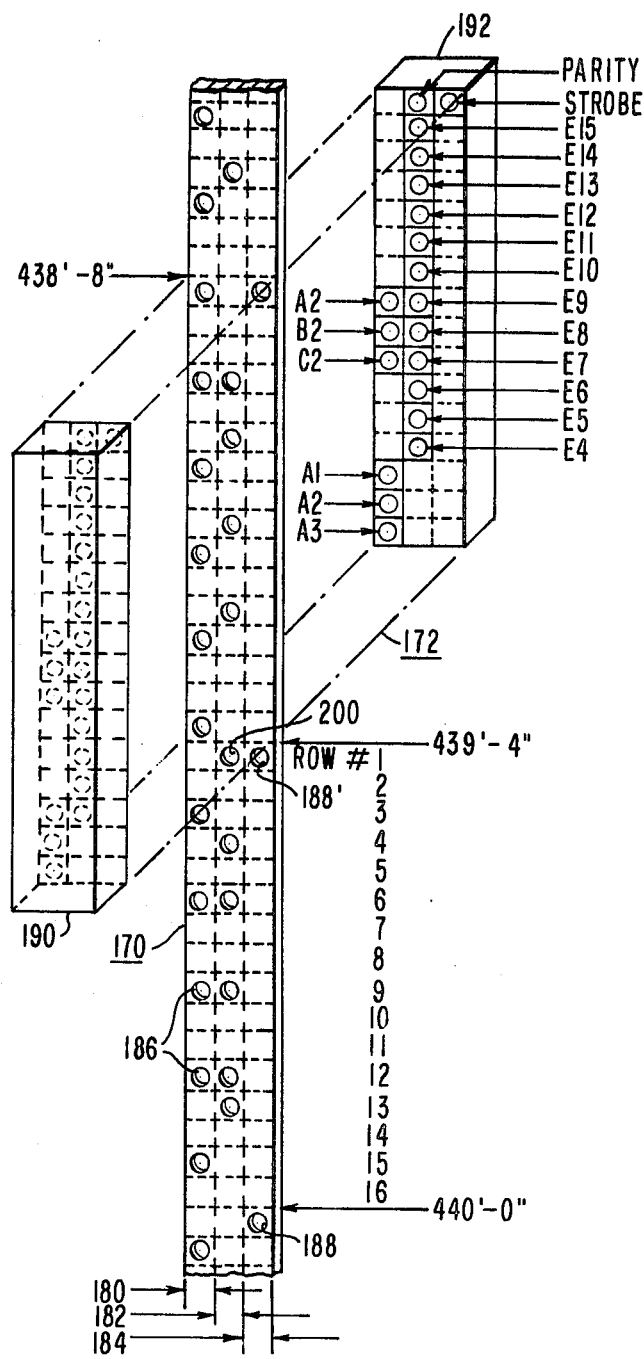
FIG. 2 is an enlarged perspective view of a coded tape and tape reader suitable for use in the elevator system shown in FIG. 1.

FIG. 2 is a perspective view of a binary coded tape which may be used for tape 170, and a tape reader arrangement which may be used for tape reader 172. Tape 170 has first, second and third vertical lanes 180, 182 and 184, respectively. One of the vertical lanes, such as the second vertical 182, includes the binary coded car position bits. Another lane, such as the first lane 180, includes indicia 186 uniformly spaced along the complete length of the tape 170. The remaining lane includes indicia 188 uniformly spaced along the length of the tape 170. Indicia 188 are spaced by the increment to which the absolute car position is to be determined, which, as hereinbefore stated, is preferably eight inches. Indicia 186 are spaced such that with three readers, a pulse will be generated every 0.5 inch of car travel by one of the three readers, if 0.5 inch is the desired resolution. Thus, the tape is effectively divided into sixteen horizontal rows every eight inches of tape length.

The binary car position bits may be read serially with a single reader pair, and stored in a suitable register; or, they may be read simultaneously by a plurality of reader pairs at each eight inch point. In general, the former arrangement would be preferred when the tape reader is car mounted, and the latter arrangement would be preferred when the tape reader is in the machine room. If the tape is stationary, the tape reader would be car mounted, and if the tape is driven by car movement, then the tape reader would be stationary, and mounted in the machine room. For purposes of example, it will be assumed that the tape reader is stationary and that it reads the binary car position bits in parallel at each eight inch point.

The tape reader 172, for example, may include a plurality of light emitting diodes 190 disposed on one side of tape 170, and a plurality of phototransistors 192 on the other side, arranged in reader pairs. The indicia may be in the form of openings provided in the tape. The openings 188 in vertical lane 184 are disposed in the first row of the sixteen vertically spaced, horizontally extending rows. A single reader pair is disposed in this row, and it provides a strobe pulse ST for each eight inches of car travel.

Thirteen reader pairs are vertically spaced to read the second vertical lane when the strobe pulse is generated. The reader pair which is in row one reads a parity bit, and the remaining twelve reader pairs read rows 2 through 13, which set forth the binary word or address which defines the position of the elevator car while the tape reader is reading this location of the tape. The signals provided by these reader pairs are referred to as singals E4-E15, with E15 being associated with row 2, E14 with row 3, etc.

For purposes of example, assume the strobe opening 188' associated with location 439'4" is read by the associated strobe reader pair. Since the length 439'4" includes 10,544 one-half inch increments, the binary address is 0010 1001 0011 0000. The four LSB's are always zero. Thus, with the most significant bit (MSB) located in row 2, only rows 4, 6, 9, 12 and 13 would have openings to describe this location. Since this is a total of five openings, an opening 200 is added at the parity location in order to provide an even number of openings, if even parity is used. If odd parity is used, of course there would be no opening at the location of the parity bit.

Two groups of reader pairs, each having three reader pairs each, are disposed to read the first vertical lane 180. One group, which provides signals or pulses A1, B1 and C1, is decoded to provide a car travel direction pulse for each 0.5 inch of car movement. The other group, which provides signals A2, B2 and C2, may be used instead of a pulse wheel to develop independent pulses at 0.5 inch increments for use by the distance-to-the-landing counter 52 shown in FIG. 1. These pulses may also be applied to a frequency-to-voltage converter 202 shown in FIG. 1, which functions as a solid state tachometer, providing a signal VT2. By providing an auxiliary car speed signal in this manner, a separate tachometer normally driven by the governor sheave, would not be required.

The tape 170 and reader 172 are arranged for relative motion when the elevator car moves in the hatch. As illustrated in FIG. 1, the tape 170 may be reeved over a sheave 204 and its ends connected to the elevator car 40 and counterweight 44 through a tension spring 173. Thus the tape 170 moves with car travel, and the reader 172 may be mounted in the machine room. Another equally suitable arrangement is to include a tape tension sheave in the pit, next to the compensation sheave 206. Thus, the tape may be a continuous loop reeved about sheave 204 and this additional sheave, with one point of the loop being fixed to the car 40. Again, the tape moves with car movement. Also, the tape 170 may be stationary, strung the length of the hatch, and the tape reader may be car mounted. With the latter arrangement, settling of the associated building may introduce errors.

Figure 3:
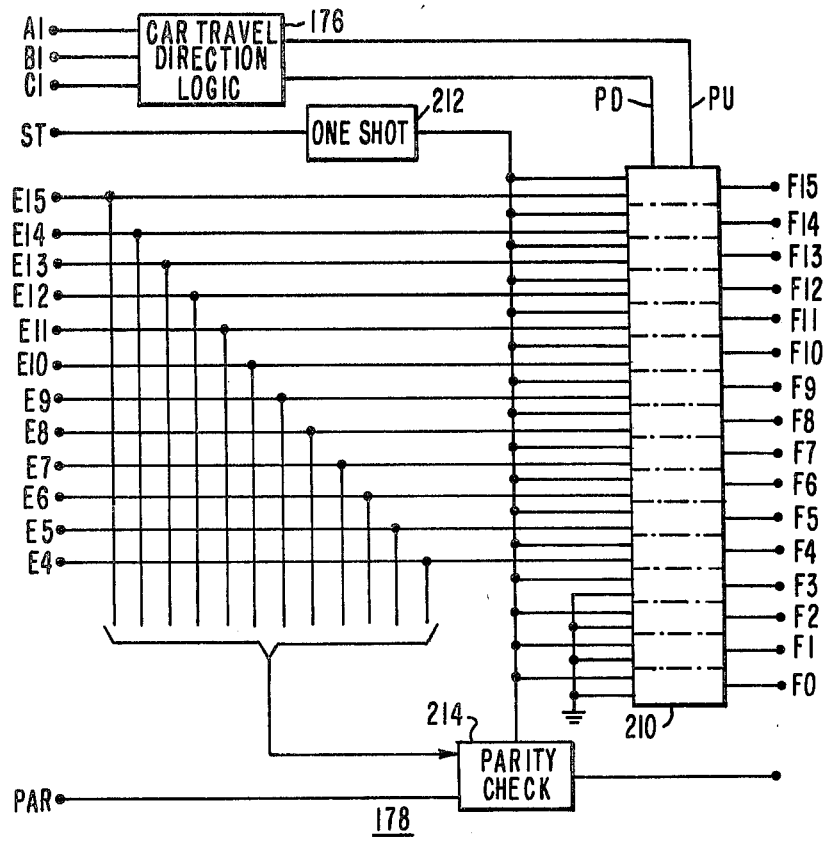
FIG. 3 is a schematic diagram of a car position counter or selector which may be used in the elevator system shown in FIG. 1.

FIG. 3 is a schematic diagram of circuitry which may be used to perform the absolute car position selector function 178 shown in FIG. 1. It includes a sixteen bit up/down counter 210. The outputs E4-E15 of tape reader control 174 are connected to the twelve most significant data inputs. The four least significant data inputs are connected to ground. Outputs A1, B1 and C1 of tape reader control 174 are converted to car travel direction pulses PU and PD, which are used to clock counter 210 up and down, respectively. The strobe pulse ST from tape reader control 174 may be connected to a pulse stretcher or one-shot multivibrator 212, and the output of multivibrator 212 is connected to the "load" input, or inputs, of counter 210.

A conventional parity check function 214 is responsive to the parity signal PAR from the tape reader control 174, to the signals E4-E15, and to the output of multivibrator 212. Function 214 provides a signal for supervisory control 129 which has a predetermined logic level when the parity checks out, and the opposite logic level when an error is detected.

In the operation of the absolute car position selector 178, when the strobe bit is detected, the binary code read at that instant by the appropriate tape reader pairs is loaded into counter 210, and the absolute position of the elevator car in the building appears at its outputs F0–F15.

While the absolute position of the elevator car 40 is determined to a 0.5 inch resolution every eight inches of car travel, the car position counter or selector 178, which is set by this count every eight inches, is incremented up, or down, every 0.5 inch between the eight inch points. This incrementing is responsive to actual car travel direction, which is determined by direction logic 176. Suitable direction logic which may be used for function 176 is shown in FIG. 4.

Figure 4:
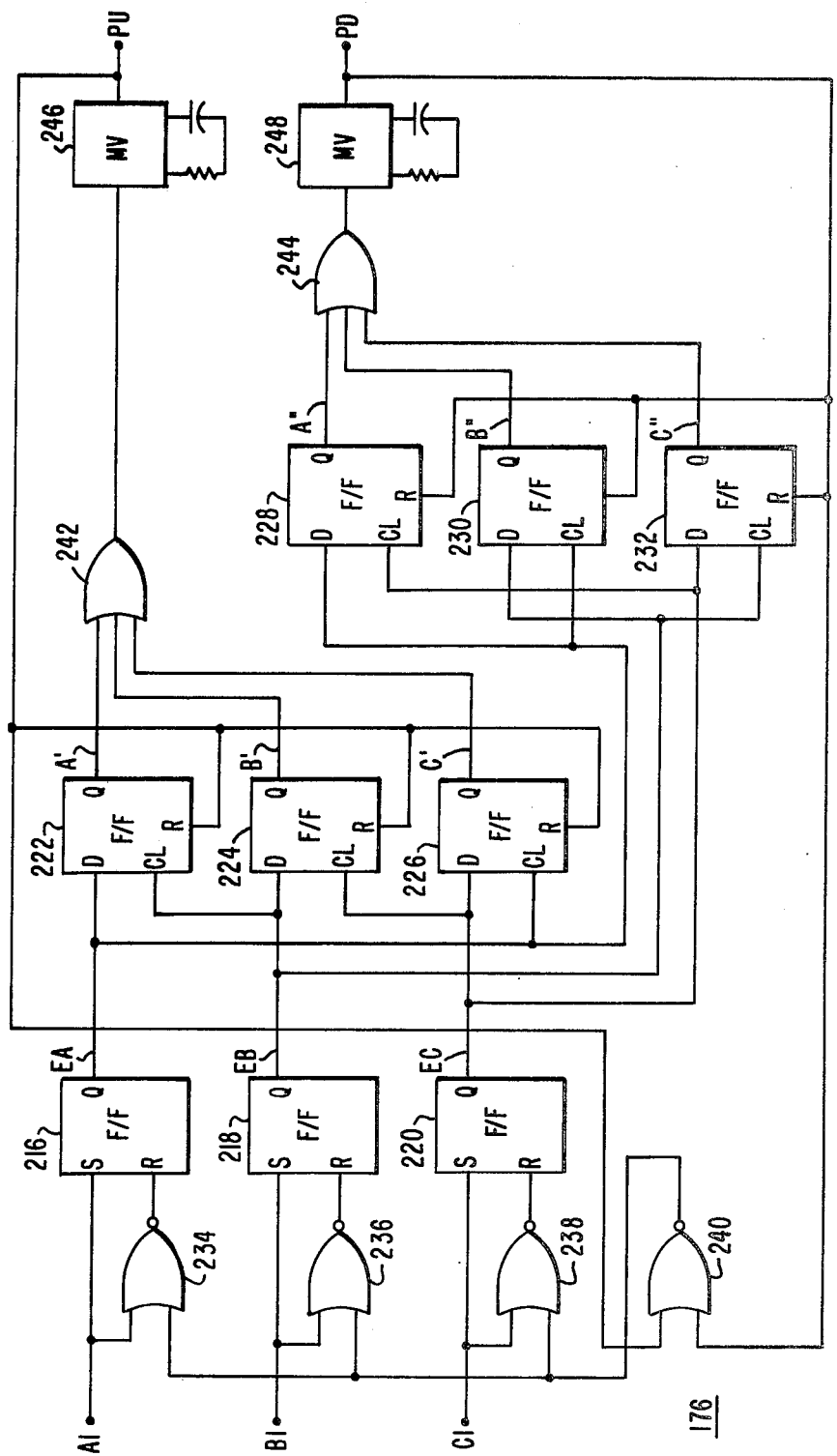
FIG. 4 is a logic diagram which illustrates actual car travel direction logic which may be used to decode travel direction and car movement pulses generated from the tape and tape reader shown in FIG. 2.

More specifically, the direction logic 176 shown in FIG. 4 includes first, second and third R-S flip-flops 216, 218 and 220, respectively, a first set of three D-type flip-flops 222, 224 and 226, and a second set of three D-type flip-flops 228, 230 and 232, four NOR gates 234, 236, 238 and 240, two OR gates 242 and 244, and two one-shot multivibrators 246 and 248. A logic one on the set input S of the R-S flip-flops sets its Q output to a logic one if the R input is a logic zero. A logic one on the reset input R sets the Q output to a logic zero. With the D-type flip-flops, a positive edge trigger applied to the clock input CL transfers the logic state appearing at the D input to the Q output. A logic one applied to the reset input R resets the Q output to a zero. The multivibrators respond to a positive edge at their inputs, to cause their outputs to go to a logic one for a predetermined period of time, which is controlled by the external RC network. The signals A1, B1 and C1 are applied to the S inputs of flip-flops 216, 218 and 220 and also to the inputs of NOR gates 234, 236 and 238. The remaining inputs to NOR gates 234, 236 and 238 are connected to the output of NOR gate 240. The Q output of flip-flop 216 is applied to the D input of flip-flop 222, to the clock input CL of flip-flop 226, to the D input of flip-flop 228, and to the clock input CL of flip-flop 230. The Q output of flip-flop 218 is connected to the clock input of flip-flop 222, to the D input of flip-flop 224, to the D input of flip-flop 230, and to the clock input of flip-flop 232. The Q output of flip-flop 220 is applied to the clock input of flip-flop 224, to the D input of flip-flop 226, to the D input of flip-flop 232, and to the clock input of flip-flop 228. The Q outputs of flip-flops 222, 224 and 226 are connected to the inputs of OR gate 242, and the output of OR gate 242 is connected to the input of multivibrator 246. The output of multivibrator 246 provides pulse signals PU. The pulse signals PU are also connected to the R inputs of flip-flops 222, 224 and 226, and it also is connected to provide an input to NOR gate 240. The Q outputs of flip-flops 228, 230 and 232 provide inputs to OR gate 244, the output of which is applied to multivibrator 248. The output of multivibrator 248 provides the pulse signals PD. The pulse signals PD are also connected to the reset inputs of flip-flops 228, 230 and 232, and it also provides the remaining input to NOR gate 240.

When the elevator car 40 is traveling upwardly, the pulses A1, B1 and C1 appear in the recited order, and the outputs EA, EB and EC of flip-flops 216, 218 and 220, respectively, go true in the recited order. This order clocks flip-flops 222, 224, and 226 to provide true outputs A', B' and C' in the recited order. The multivibrator 246 functions as a pulse stretcher to provide pulses PU which increment the absolute car position selector 178, one count for each 0.5 inch of travel.

When the elevator car 40 is traveling downwardly, pulses B1, A1 and C1 appear in the recited order, which causes outputs EB, EA and EC of flip-flops 218, 216 and 220 respectively, to go true in the recited order. This order clocks flip-flops 232, 230 and 228 to provide a succession of momentary pulses which are stretched by multivibrator 248 to provide pulses PD. Pulses PD are used to decrement the absolute car position selector 178, one count for each 0.5 inch of car travel.

Figure 6:
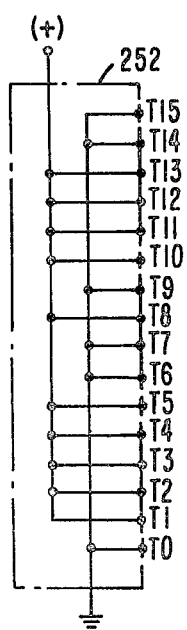
FIG. 6 is a schematic diagram which may be used to develop the highest count T for the associated building.
Figure 7:
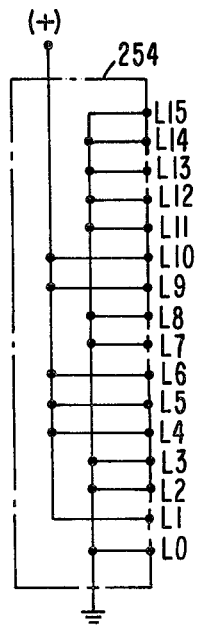
FIG. 7 is a schematic diagram which may be used to develop the count L respresentative of the normal slowdown distance of the elevator car from rated or contract speed.
Figure 8:
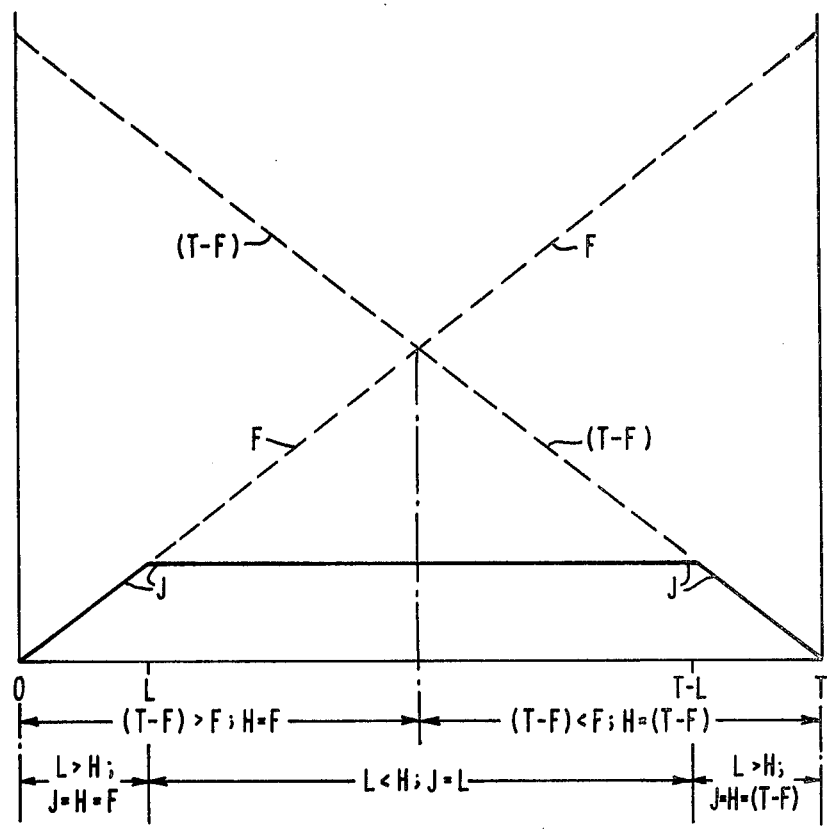
FIG. 8 is a graph which aids in understanding the pattern limit generator shown in FIG. 5.

Now that the absolute position of the elevator car 40 has been determined to a 0.5 inch resolution, with the absolute determinations being made every eight inches of car travel, and with the car position counter or selector being updated every 0.5 inch of travel between the eight inch points, the aspect of the invention related to the development of the global pattern limit reference will be described. The reference is generated in a pattern limit generator 250 in response to the absolute car position signal F0–F15. FIG. 5 illustrates a pattern limit generator 250 which may be used, which utilizes the variable signal F0–F15, hereinafter called F, which describes car position; a fixed sixteen bit signal T0–T15, hereinafter called T, which sets forth the highest count for the rise of the building; and a fixed sixteen bit signal L0–L15, hereinafter called L, which sets forth a count which describes the normal slowdown distance of elevator car 40 from rated speed. The counts indicate the number of 0.5 inch increments in the associated distances. FIGS. 6 and 7 are hardwired circuits 252 and 254 which illustrate exemplary developments of signals T and L, respectively. FIG. 8 is a graph which may be referred to as an aid in understanding the following description of the pattern limit generator 250.

In general, the associated building may first be divided into upper and lower halves. The building is also divided into upper and lower terminal zones, i.e. the distance L from the top and bottom floors, and an intermediate zone between the terminal zones.

First, the position of the elevator car is defined relative to the distance of the car 40 from the bottom terminal floor, when the elevator car is in the bottom one-half of the building, and the distance of the car 40 from the top terminal floor, when it is in the upper one-half of the building. The distance of the car 40 from the pertinent terminal floor will be referred to as signal H0–H15, hereinafter called H. Signal H is developed by a subtractor 256, a comparator 258, a first set 260 of analog switches, a second set 262 of analog switches, and an OR function 264. Subtractor 256 subtracts the absolute car position F, which contains a count representative of the distance of the car 40 from the bottom terminal landing, from the count T, representative of the distance between the bottom and top landings. The car position signal F is also applied to comparator 258 and switches 260. The output (T-F) from subtractor 256 is applied to comparator 258 and switches 262. The outputs of switches 260 and 262 are applied to OR function 264, and the output of OR function 264 provides signal H. Comparator 258 compares the car position count F with the output (T-F) of subtractor 256. If the car 40 is in the lower one-half of the building count T-F will exceed count F, and the associated output of comparator 258 enables switches 260. Thus, signal H will be equal to signal F. If car 40 is located in the upper one-half of the building, the count T-F will be less than the count F, and the associated output of comparator 258 enables switches 262. Thus, signal H will be equal to the count T-F.

Next, the position of the elevator car relative to a terminal zone is defined by a signal J0-J15, hereinafter called J, with signal J being set to be equal to signal L when the car is in the intermediate zone, and with signal J being made equal to signal H when the car is within either terminal zone, i.e. within the distance L from the top or bottom landing. Signal J is developed by a comparator 266, analog switches 268, analog switches 270, and an OR function 272. Signal H is applied to comparator 266 and switches 268. Signal L is applied to comparator 266 and switches 270. The outputs of switches 268 and 270 are applied to OR function 272, and the output of OR function 272 is the signal J. Comparator 266 compares signals H and L. If signal L exceeds signal H, the car is within a terminal zone and comparator 266 enables switches 268. Thus, signal J is then made equal to signal H. If count L is less than count H, the car is outside either terminal zone, and comparator 266 enables switches 270. Thus, signal J, in this instance, is equal to signal L.

The development of a pattern limit signal PL for all positions of the elevator car 40 in the hatch will now be described. Count J is applied to a digital-to-analog converter 274, and the resulting analog signal J' is applied to a slowdown pattern generator 276. The slowdown pattern generator 276 obtains a slowdown curve or speed pattern Z for use in each terminal zone by basically taking the square root of the distance to go to the terminal landing. The slowdown pattern Z is given by the following relationship:

$$Z = \sqrt{2a J' + V_f^2} - \tau a$$

In this relationship, a is equal to the maximum slowdown rate in ft/sec$^2$, J' is the distance to go to the landing, $\tau$ is the system time lag in seconds, and $V_f$ is the desired speed of the elevator car at the point of transfer to a landing pattern. A slowdown pattern generator which may be used for function 276 is described in detail in U.S. Pat. No. 3,747,710, and the circuitry of function 276 is preferably the same circuitry as used in the speed pattern generator shown in FIG. 1 for developing the normal speed pattern VSP from the distance pulses NLC. These NLC pulses may be independently developed from tape reader signals A2, B2 and C2, which are applied to an OR function 278. The output of OR function 278 provides pulses for control 129, which in turn provides the NLC pulses for counter 52.

In general, slowdown pattern generator 276 adds signal J', after multiplication by 2a, to a bias voltage representative of $V_f^2$ and the sum is applied to a square root device. A bias is then added to the square root value, to simulate the product of the system system time lag $\tau$ multiplied by the maximum deceleration rate a.

When the elevator car is outside a terminal zone, the input J to the D/A converter 274 is equal to L, which provides a pattern limit signal Z equal to the rated speed, i.e. equal to the maximum value of the normal speed pattern signal. When the elevator car 40 approaches either terminal landing, within a terminal zone, the pattern limit signal Z is equal to the normal deceleration slowdown speed pattern. When the elevator car 40 is in a terminal zone, but accelerating away from the associated terminal floor, a pattern limit is developed by adding a factor U to the signal Z. The signal U, which is proportional to $2\tau a$ (twice the system time lag in seconds multipled by the maximum acceleration rate in ft/sec$^2$) is developed by a source 280 of positive potential, a switch 282, such as the NPN transistor illustrated in FIG. 5, AND gates 286 and 288, and an OR gate 290. Signals DGU and DGD, provided by control 129, are true when the elevator car is to travel up and down, respectively. These signals are developed in U.S. Pat. No. 3,750,850, which patent is assigned to the same assignee as the present application. Signals DGU and DGD are applied to inputs of AND gates 286 and 288, respectively. The output of comparator 258 which is high when count T-F exceeds count F is applied to an input of AND gate 286; and, its output which is high when count T-F is less than count F is applied to AND gate 288. The output of comparator 266 which is high when count L exceeds count H is applied to an input of both AND gates 286 and 288. Thus, when the elevator car 40 is in the lower one-half of the building, traveling upwardly within a terminal zone, AND gate 286 applies a logic one to OR gate 290, turning transistor 282 on to apply a bias voltage U to the pattern limit voltage Z. In like manner, when the elevator car 40 is in the upper one-half of the building, traveling downwardly in a terminal zone, AND gate 288 will output a logic one to turn transistor 282 on.

When the elevator car reaches a point ten inches from the floor at which it is to stop, a signal LAZO goes high, which signal is developed in U.S. Pat. No. 4,019,606, for example, to transfer the limiting pattern to the maximum value of the landing zone pattern provided by function 292. First and second analog switches 294 and 296, respectively, and a polarity inverting gate 298 may be used to make the transfer. The output of summing point 300 is applied to the input of analog switch 294, and the output of the ten inch pattern generator is applied to the input of switch 296. Signal LAZO is applied to the control input of switch 294 via inverter gate 298, and signal LAZO is applied directly to the control input of switch 296. The output of the switches are applied to output terminal PL which provides the pattern limit signal PL.

As shown in FIG. 1, the pattern limit signal PL may be compared with the output of the buffer and absolute value amplifier 114, after polarity inversion in an inverting amplifier 302, via a comparator 304. The output of comparator 304 is applied to junction 130 via a diode 306. If the normal pattern exceeds the pattern limit PL, pattern limiting occurs as hereinbefore described. Alternatively, the pattern limit signal PL may be used as the reference for comparator 152, but the arrangement illustrated provides a redundancy which may be desirable.

FIG. 9 is a graph which represents the run of elevator car 40 from the bottom to the top landing. Curve VSP is the normal speed pattern, curve Z the pattern limit for full speed and slowdown, curve Z+U the pattern limit during acceleration away from the terminal, and V the actual speed of the elevator car. The heavy line portions indicate pattern limiting. As the car 40 is leaving the lower terminal, curve Z is raised by an amount $2\tau a$, which is the signal U, to provide a limit for the normal acceleration pattern. At the lower amplitudes and also at the higher amplitudes of the limit Z+U, the limit is above the normal up acceleration pattern. The limit Z+U and the normal pattern are coincident in midrange. The peak limit 136 provides protection when Z+U is greater than the peak limit reference. After the car is farther than distance L from the bottom terminal, the global pattern reference returns to the normal full-speed value, as U is reduced to zero. When the car approaches the top terminal, signal Z is the deceleration pattern reference limit. The normal pattern signal, by clamping, cannot exceed the pattern reference limit.

FIG. 10 is a graph similar to that of FIG. 9 except for a run from the top to the bottom landing.

Figure 11:
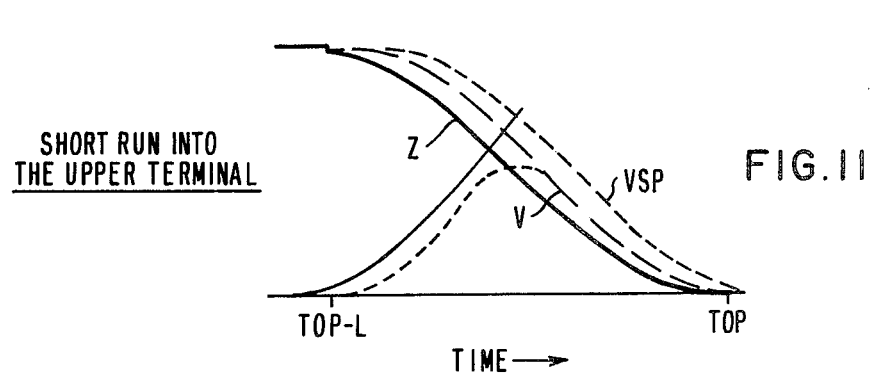
FIG. 11 is a graph similar to those of FIGS. 9 and 10, except it illustrates a car making a short run into the upper terminal floor or landing.

FIG. 11 is a graph which illustrates the elevator car 40 making a short run into the upper terminal landing, with the normal selector out of step and behind the car. The approach limit included in function 136, described in the incorporated U.S. Pat. No. 4,161,235, functions to limit the rate of approach to the pattern limit reference. Alternatively, the jerk reduction scheme disclosed in U.S. Pat. No. 3,759,350, may be used. The arrangement in this patent causes the acceleration pattern to stop rising when the difference between it and signal Z is less than a given value.

The final aspect of the invention occurs inherently in the pattern limit arrangement described. It automatically provides a separate, redundant terminal slowdown and stopping arrangement which is directly related to the absolute position of the elevator car. This is a desirable arrangement, as it eliminates hatch-mounted cams, switches, slowdown blades, and the like.

In summary, there has been disclosed a new and improved elevator system which develops absolute car position with a straight-forward binary code, physically oriented serially relative to car direction. Thus, only a single vertical lane is required for the position code on the tape. The absolute car position is used to develop a continuous speed pattern limit for all positions of the elevator car in the hatch, which may function as a variable reference into a speed pattern clamp. In addition to clamping the maximum value of the speed pattern, and in addition to providing a limit signal when the elevator accelerates away from the terminal floor, when the car approaches a terminal floor in a terminal zone the pattern limit generated is used as a variable reference into the pattern clamp. This is analogous to an analog AND circuit, which causes the outputted pattern to always agree with the input having the least amplitude. This terminal slowdown protection functions automatically without need for detection that auxiliary terminal slowdown protection is required. The pattern limit reference is identical with the normally generated pattern when the normal system is performing correctly. The pattern limit reference, therefore, will cause the elevator car to make a normal landing when the normal system pattern is too high, such as when the normal selector is out of step and behind the car. Thus, it functions as an independent, redundant terminal slowdown protection.

While not shown, it would be a simple matter following a power outage to move the elevator car eight to sixteen inches at low speed to determine the absolute car position, and then to use the corresponding count to reload and reset the normal solid state floor selector.

I claim as my invention:

1. An elevator system, comprising:
   an elevator car,
   motive means for moving said elevator car in a predetermined travel path having upper and lower terminal zones and an intermediate zone,
   car position means providing a car position signal responsive to the absolute position of said elevator car, at least in the upper and lower terminal zones,
   means providing a reference signal responsive to said car position signal,
   speed pattern means providing a speed pattern signal indicative of the desired speed of said elevator car,
   limit means for providing a limiting signal responsive to said reference signal, at least when said elevator car is in one of said terminal zones,
   means having inputs responsive to said speed pattern signal and to said limiting signal for providing an auxiliary speed pattern signal which is responsive to the input signal of lesser magnitude at any instant,
   means providing a velocity signal responsive to the actual speed of said elevator car,
   and means for controlling said motive means in response to said velocity signal and said auxiliary speed pattern signal.

2. The elevator system of claim 1 wherein the car position means provides a car position signal when the elevator car is in a terminal zone traveling towards the other terminal zone, and the limit means provides the limiting signal in response thereto.

3. The elevator system of claim 1 wherein the car position means provides a car position signal when the elevator car is in the intermediate zone, and the limit means provides the limiting signal when the elevator car is in the intermediate zone.

4. The elevator system of claim 1 wherein the car position means includes a binary coded tape and tape reader means arranged for relative motion in response to movement of the elevator car.

5. The elevator system of claim 4 wherein the position determining code on the coded tape is in a single lane, in serial alignment with car movement, and the tape reader means includes a plurality of binary code bit readers which read the coded tape at predetermined increments of car travel.

6. The elevator system of claim 5 wherein the predetermined interval of car travel is eight inches, reducing the required number of bit readers by four.

7. The elevator system of claim 5 including a car position counter which is responsive to the binary code bit readers.

8. The elevator system of claim 7 wherein the binary coded tape includes an additional lane, with said additional lane having uniformly spaced indicia, and the tape reader means includes three bit readers for this lane, and including travel direction decoding means responsive to said three bit readers which pulses the car position counter in a direction responsive to the car travel direction, to cause the car position counter to define the car position between the predetermined increments of car travel at which the position determining code is read.

9. The elevator system of claim 1 wherein the limiting signal provided by the limit means is similar in magnitude to the desired speed pattern signal when it is operating normally, such that a deviation of the desired speed pattern signal above its desired value causes the auxiliary speed pattern signal to follow the limiting signal from the instant of such deviation.

10. An elevator system, comprising:
    an elevator car, motive means for moving said elevator car in a predetermined travel path having upper and lower terminal zones and an intermediate zone, car position means providing a car position signal responsive to the absolute position of said elevator car in at least in the upper and lower terminal zones, first and second speed pattern means providing first and second speed pattern signals, respectively, at least in the upper and lower terminal zones, each indicative of the desired speed of said elevator car as it approaches the ends of the terminal zones, said second speed pattern means providing said second speed pattern signal in response to the car position signal provided by said car position means, means providing an auxiliary speed pattern signal in response to the lesser of said first and second speed pattern signals at any instant, means providing a velocity signal responsive to the actual speed of said elevator car, and means for controlling said motive means in response to said auxiliary speed pattern signal and said velocity signal.

11. The elevator system of claim 10 including auxiliary pulse means, and wherein the first speed pattern means provides said first speed pattern signal in response to a count representative of the normal slowdown distance, which count is decremented by the pulses generated by said auxiliary pulse means in response to movement of the elevator car when the elevator car reaches the slowdown distance from the end of a terminal zone.

12. The elevator system of claim 10 wherein the car position signal includes a binary coded tape and tape reader means arranged for relative motion in response to movement of the elevator car, and the car position signal includes a count which is read from the binary coded tape by said tape reader means at predetermined increments of car travel.

* * * * *